(12) United States Patent
Tseng et al.

(10) Patent No.: US 9,161,454 B2
(45) Date of Patent: Oct. 13, 2015

(54) ELECTRICAL DEVICE PACKAGE STRUCTURE AND METHOD OF FABRICATING THE SAME

(71) Applicant: Unimicron Technology Corp., Taoyuan (TW)

(72) Inventors: Tzyy-Jang Tseng, Hsinchu (TW); Shu-Sheng Chiang, Taipei (TW); Tsung-Yuan Chen, Taoyuan County (TW); Shih-Lian Cheng, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 129 days.

(21) Appl. No.: 13/726,230

(22) Filed: Dec. 24, 2012

(65) Prior Publication Data

US 2014/0174804 A1   Jun. 26, 2014

(51) Int. Cl.

| | |
|---|---|
| H05K 1/16 | (2006.01) |
| H05K 1/18 | (2006.01) |
| H01L 23/538 | (2006.01) |
| H01L 23/00 | (2006.01) |
| H05K 3/00 | (2006.01) |
| H05K 3/46 | (2006.01) |

(52) U.S. Cl.
CPC ............ *H05K 1/185* (2013.01); *H01L 23/5389* (2013.01); *H01L 24/19* (2013.01); *H05K 1/18* (2013.01); *H05K 1/183* (2013.01); *H05K 3/007* (2013.01); *H05K 3/465* (2013.01); *H05K 2203/0723* (2013.01); *H05K 2203/1469* (2013.01); *Y10T 29/4913* (2015.01)

(58) Field of Classification Search
CPC ....... H05K 1/183; H05K 3/303; H05K 1/185; H05K 3/465; H05K 2203/0723; H05K 2203/1469; H05K 3/007; H01L 24/19; H01L 23/5389; Y10T 29/4913
USPC ........... 174/250–268; 361/760–761, 792–795
See application file for complete search history.

(56) References Cited

U.S. PATENT DOCUMENTS

| 7,341,890 B2 * | 3/2008 | Ishimaru et al. .............. 438/125 |
| 7,697,301 B2 * | 4/2010 | Lee et al. ...................... 361/763 |

(Continued)

FOREIGN PATENT DOCUMENTS

| TW | I290349 | 11/2007 |
| TW | 201003865 | 1/2010 |
| TW | 201031296 | * 8/2010 |

OTHER PUBLICATIONS

"Office Action of Taiwan Counterpart Application", issued on Nov. 19, 2014, p. 1-p. 7, in which the listed references were cited.

*Primary Examiner* — Ishwarbhai B Patel
(74) *Attorney, Agent, or Firm* — Jianq Chyun IP Office

(57) ABSTRACT

A method of packaging an electrical device including following steps is provided. A circuit board including a substrate and a first conductive pattern is provided. The electrical device having an electrode is disposed on the circuit board. A dielectric layer is formed on the circuit board to cover the electrical device, the electrode and the first conductive pattern, wherein a first caving pattern is formed in the dielectric layer by the first conductive pattern. The dielectric layer is patterned to form a through hole and a second caving pattern connecting with the through hole and exposing the electrode. A conductive material is filled in the through hole and the second caving pattern to form a conductive via in the through hole and a second conductive pattern in the second caving pattern. The substrate is removed. Moreover, the electrical device package structure is also provided.

4 Claims, 11 Drawing Sheets

(56) References Cited

U.S. PATENT DOCUMENTS

| | | |
|---|---|---|
| 8,003,895 B2 * | 8/2011 | Sunohara et al. ............. 174/260 |
| 8,097,943 B2 | 1/2012 | Badakere et al. |
| 2004/0145044 A1 * | 7/2004 | Sugaya et al. ................ 257/698 |
| 2005/0118750 A1 * | 6/2005 | Baba et al. .................... 438/128 |
| 2008/0298023 A1 * | 12/2008 | Okimoto et al. .............. 361/715 |
| 2010/0103635 A1 * | 4/2010 | Tuominen et al. ............ 361/764 |
| 2010/0314352 A1 | 12/2010 | Chen et al. |

* cited by examiner

ELECTRICAL DEVICE PACKAGE STRUCTURE AND METHOD OF FABRICATING THE SAME

BACKGROUND OF THE INVENTION

1. Field of the Invention

The invention relates to a device package structure and a method of fabricating the same. More particularly, the invention relates to an electrical device package structure and a method of fabricating the same.

2. Description of Related Art

In recent years, with the rapid progress of electronic technologies and advancement of high-tech electronic industry, human-oriented electronic products with superior performance have brought forth a new era. These electronic products are usually embedded with circuit boards on which electrical devices are disposed. The trend of designing electronic products goes towards light, thin, compact and small and the thickness of circuit boards goes towards miniaturization.

However, in conventional techniques, manufacturers fabricate electrical devices and circuit boards, respectively, to support electrical devices. Then, electrical devices are packaged on circuit boards to form electrical device package structures. Such process takes not only laboring and time, but also have difficulties to reduce the overall thickness of electrical device package structures. According to the above, one of objectives that researchers try to achieve is to develop a method of fabricating thin electrical device package structure.

SUMMARY OF THE INVENTION

The invention provides a method of packaging an electrical device which can fabricate an electrical device package structure having a reduced thickness as a whole.

The invention provides an electrical device package structure having a reduced thickness as a whole.

One embodiment of the invention provides a method of packaging an electrical device including the following steps: providing a circuit board, wherein the circuit board includes a substrate and a first conductive pattern disposed on the substrate; disposing the electrical device on the circuit board, wherein the electrical device has at least one electrode; forming a dielectric layer on the circuit board to cover the electrical device, the electrode and the first conductive pattern, wherein the first conductive pattern forms a first caving pattern on the dielectric layer; patterning the dielectric layer to form a through hole extended to the first conductive pattern and a second caving pattern connecting with the through hole and exposing the electrode; filling a conductive material in the through hole and the second caving pattern to form a conductive via in the through hole and a second conductive pattern in the second caving pattern, and removing the substrate; forming a first solder mask and a second solder mask on the first conductive pattern and the second conductive pattern, respectively, wherein the first solder mask exposes portions of the first conductive pattern and the second solder mask exposes portions of the second conductive pattern.

One embodiment of the invention provides an electrical device package structure including a dielectric layer, an electrical device, a first conductive pattern, a second conductive pattern, a conductive via, a first solder mask and a second solder mask. The dielectric layer has a first surface, a second surface opposite to the first surface, a first caving pattern disposed on the first surface and caved into the first surface, at least one second caving pattern disposed on the second surface and trenched the second surface and at least one through hole extended from the first caving pattern to the second caving pattern. An electrical device is embedded in the dielectric layer and has at least one electrode and the second caving pattern exposes the electrode. The first conductive pattern is filled in the first caving pattern. The second conductive pattern is filled in the second caving pattern and connected with the electrode of the electrical device, and the conductive via is filled in the through hold and connected with the first conductive pattern and the second conductive pattern. The first solder mask is disposed on the first surface and the first conductive pattern of the dielectric layer and exposes portions of the first conductive pattern. The second solder mask is disposed on the second surface and the second conductive pattern of the dielectric layer and exposes portions of the second conductive pattern.

In view of the foregoing, in the invention, the electrical device can be embedded in the dielectric layer to reduce significantly the overall thickness of the electrical device package structure. In addition, the overall thickness of the electrical device package structure can be further reduced by filling a conductive material in the caving patterns of the dielectric layer to form conductive patterns.

In order to make the aforementioned features and advantages of the invention more comprehensible, embodiments accompanying figures are described in details below.

DETAILED DESCRIPTION OF THE EMBODIMENTS

Figure 1A:
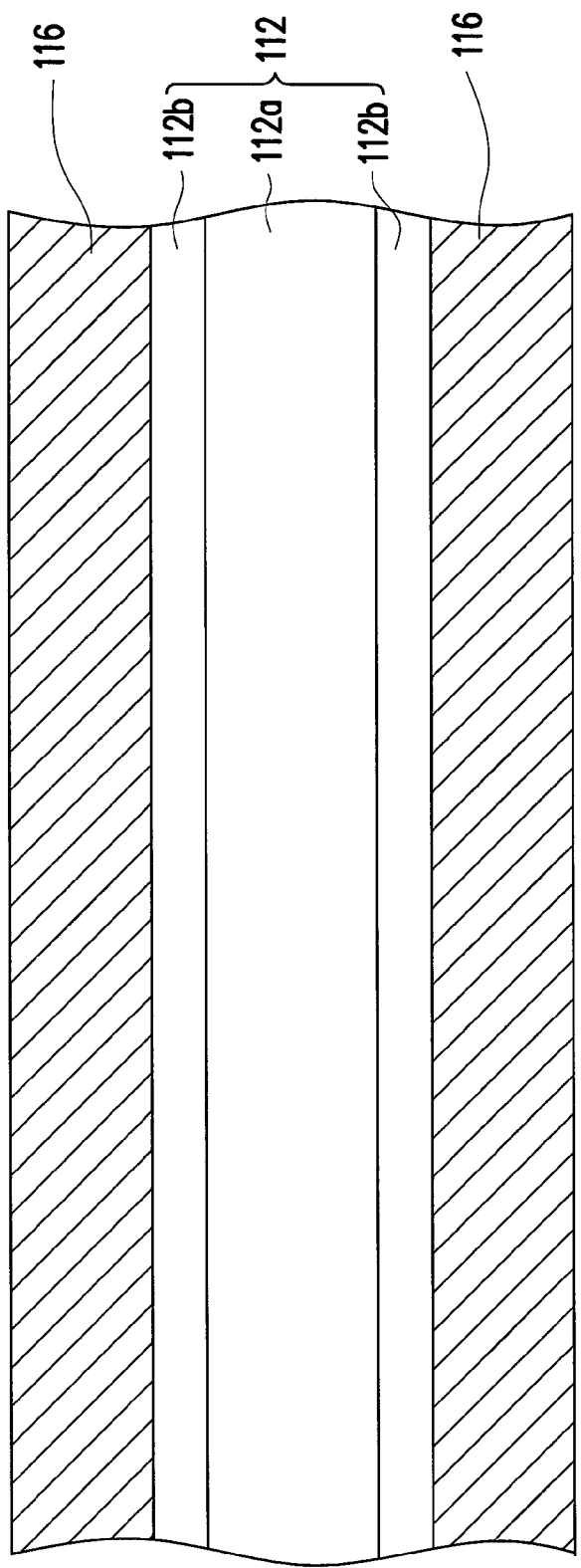
FIG. 1A to FIG. 1K are schematic cross-sectional views of a method of packaging an electrical device according to an embodiment of the invention.
Figure 1B:
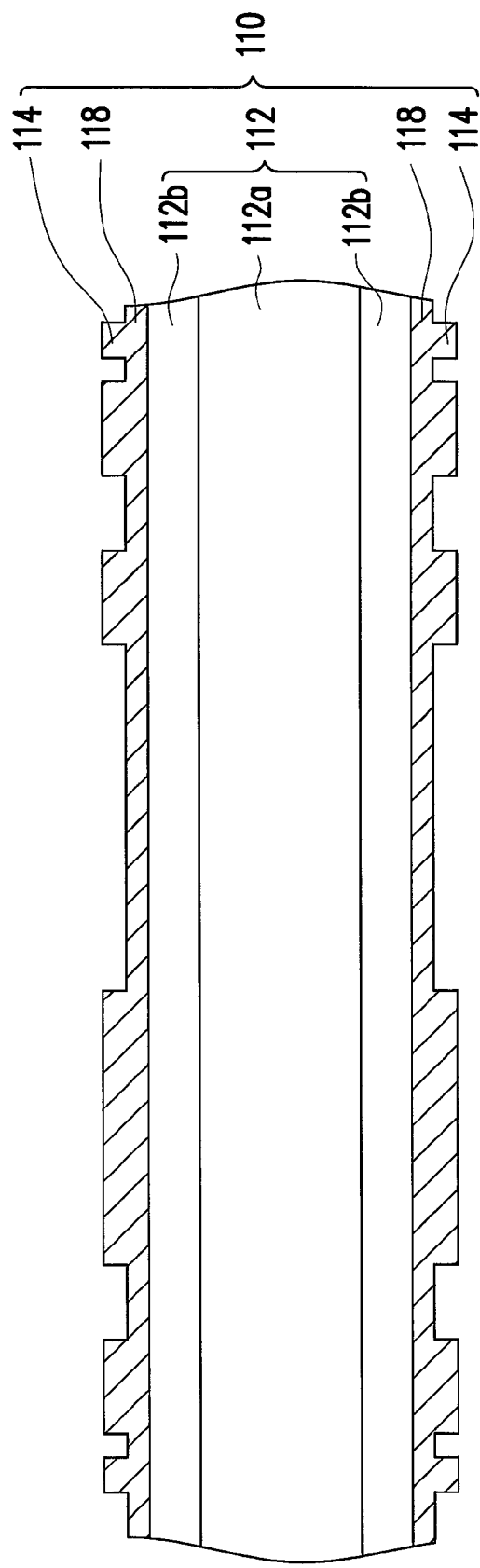

FIG. 1A to FIG. 1K are schematic cross-sectional views of a method of packaging an electrical device according to an embodiment of the invention. Referring to FIG. 1A and FIG. 1B. First, a circuit board 110 (illustrated in FIG. 1B) is provided, wherein the circuit board 110 includes a substrate 112 and first conductive patterns 114 disposed on the substrate 112. In the present embodiment, the substrate 112 includes a substrate 112a and barrier layers 112b covering two opposite surfaces of the substrate 112a. A material for the substrate 112a can be, for example, metal or high molecular polymer and a material for the barrier layers 112b can be, for example, metal (including aluminum or nickel) or polymer, but the invention is not limited thereto.

In the present embodiment, the method of providing the circuit board 110 includes following steps. First, as shown in FIG. 1A, the substrate 112 and first conductive layers 116 disposed on the substrate 112 are provided. Next, as shown in FIG. 1B, the first conductive layers 116 are patterned to form electroplated seed layers 118 and the first conductive patterns 114 disposed on the electroplated seed layers 118. More specifically, in the present embodiment, the step of forming the first conductive patterns 114 by patterning the first conductive layers 116 includes a semi-additive process. A material for the electroplated seed layers 118 and the first conductive patterns 114 of the present embodiment can be the same. A material for the electroplated seed layers 118 and the first conductive patterns 114 can be, for example, copper.

However, the method of providing the circuit board of the invention is not limited as described above. FIG. 2A to FIG. 2B illustrate a method of providing a circuit board according to another embodiment of the invention. Referring to FIG. 2A and FIG. 2B. First, a circuit board 110A (illustrated in FIG. 2B) is provided, wherein the circuit board 110 includes a substrate 112 and first conductive patterns 114 disposed on the substrate 112. Specifically, the conductive patterns 114 expose portions of the substrate 112. More particularly, as shown in FIG. 2A, the substrate 112 and first conductive layers 116 disposed on the substrate 112 are provided first. Next, as shown in FIG. 2B, the first conductive layers 116 are patterned to form the first conductive patterns 114. In the present embodiment, the step of forming the first conductive patterns 114 by patterning the first conductive layers 116 includes a subtractive process. In brief, in other embodiments, first conductive patterns 114 can be formed without forming electroplated seed layers 118. As such, in a method of packaging an electrical device, the step of removing electroplated seed layers 118 can be omitted (as shown in FIG. 1H) and makes a method of packaging an electrical device simpler. In addition, it is to be noted that the method of providing the circuit board as illustrated in FIG. 2A and FIG. 2B can also be applied to the following steps (as shown in FIG. 1C to FIG. 1G, FIG. 1J and FIG. 1K) and then an electrical device package structure can be formed. The aforementioned can be referred by people of ordinary skill in the art and therefore are not described in details one by one in the following paragraphs.

Figure 1C:
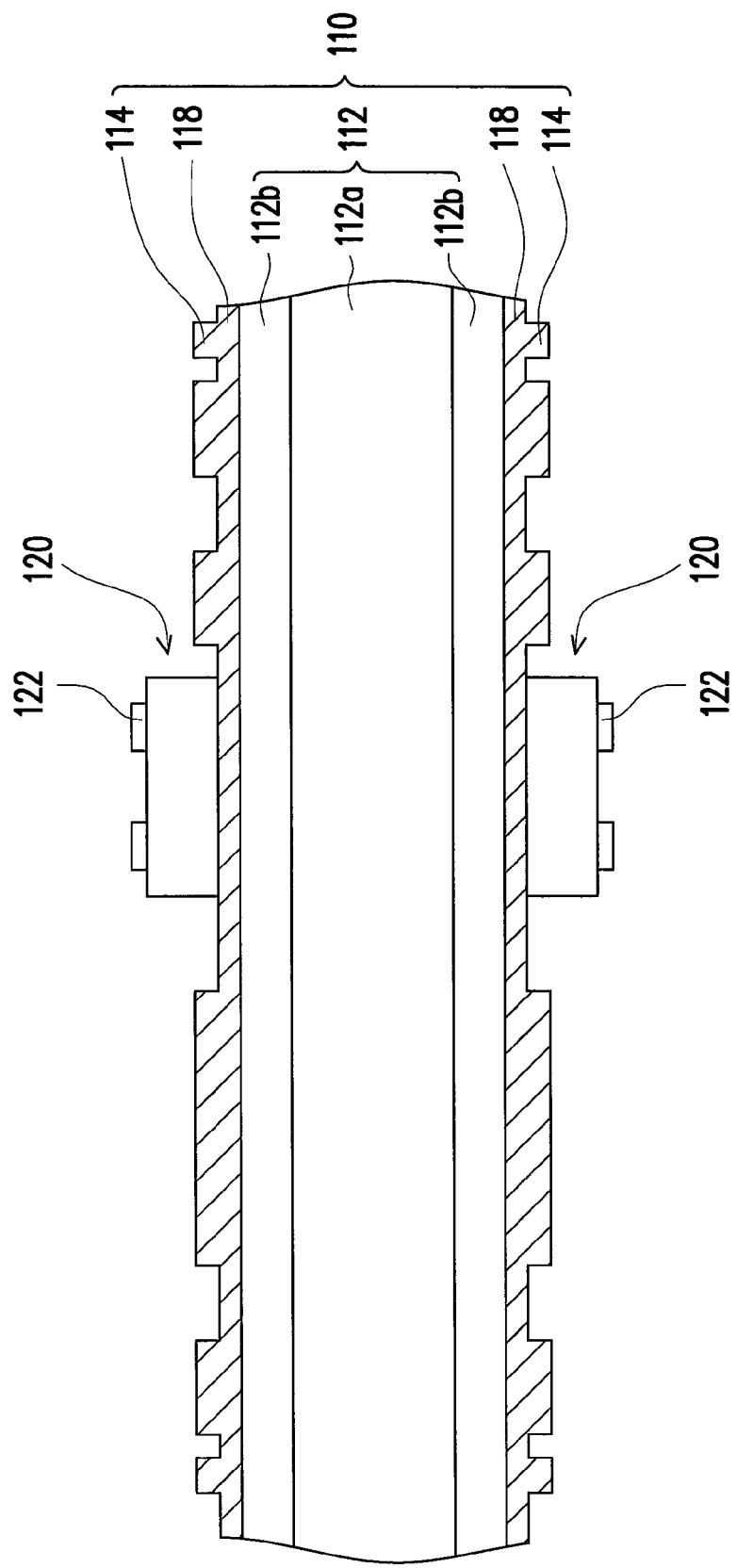
Figure 1D:
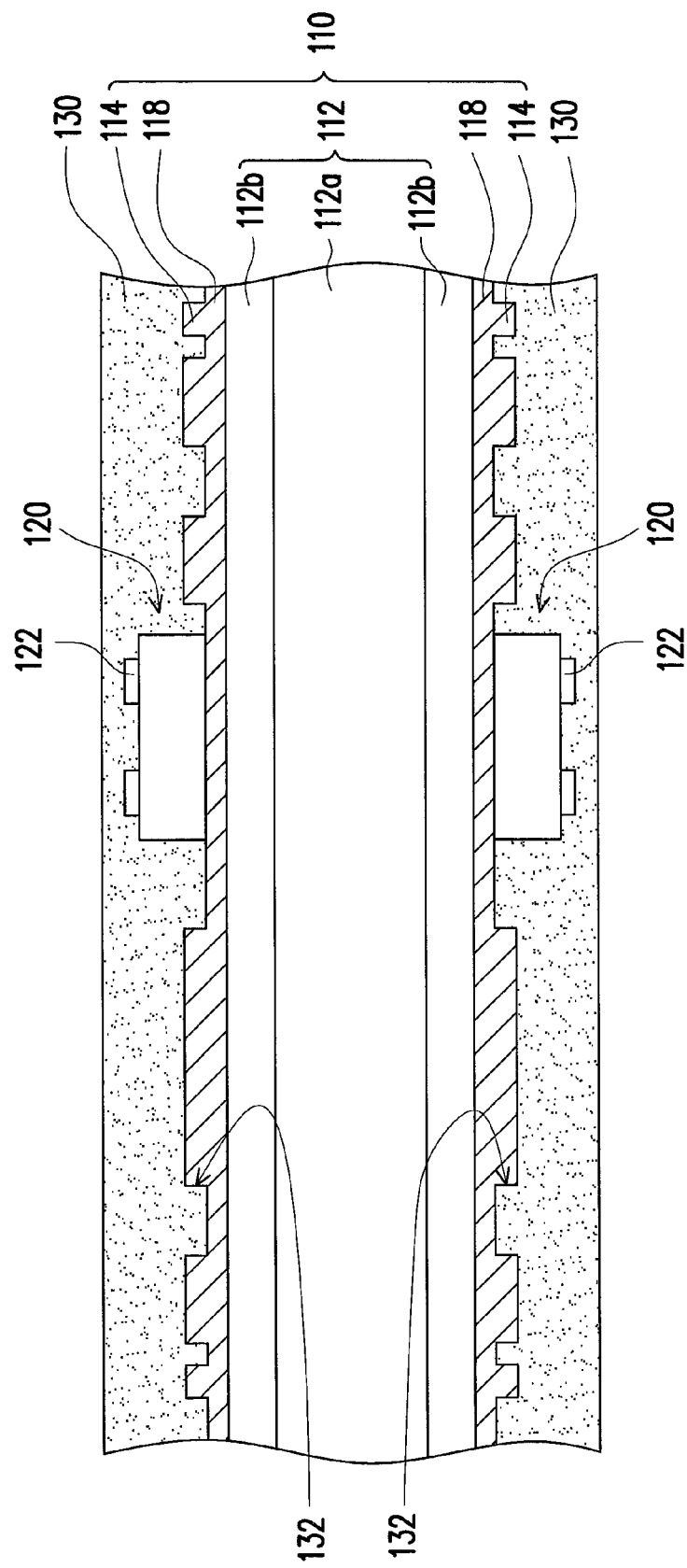
Figure 2A:
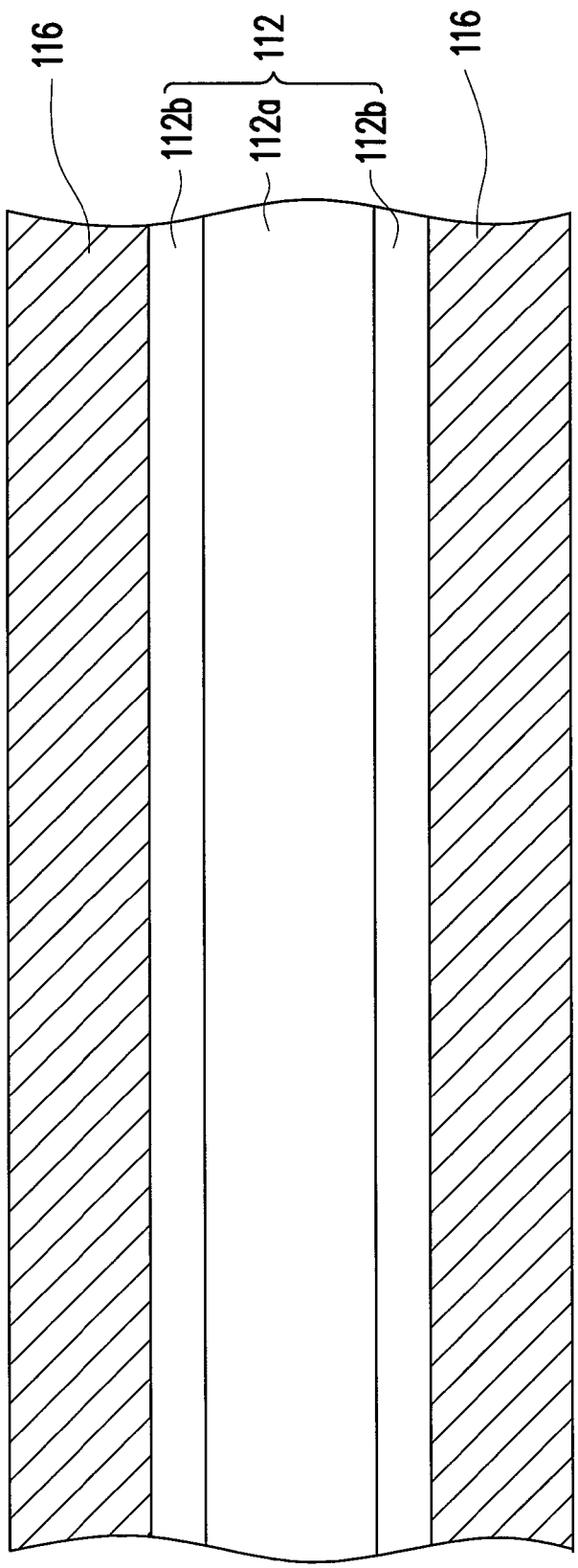
FIG. 2A to FIG. 2B illustrate a method of providing a circuit board according to another embodiment of the invention.
Figure 2B:
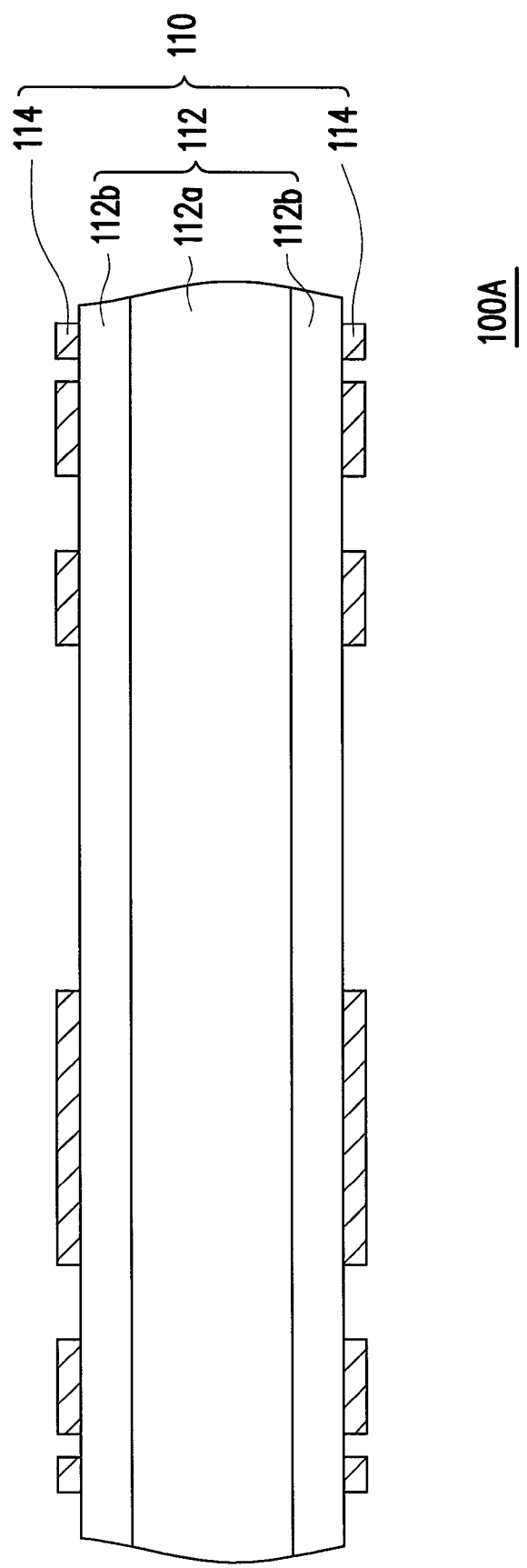

Referring to FIG. 1C. Next, electrical devices 120 is disposed on the circuit board 110. The electrical device 120 has at least one electrode 122. In the present embodiment, in the step of disposing the electrical device 120 on the circuit board 110, the electrical device 120 can be disposed on the electroplated seed layers 118. Referring to FIG. 1D. Next, dielectric layers 130 are formed on the circuit board 110 to cover the electric devices 120, the electrodes 122 and the first conductive patterns 114, wherein first caving patterns 132 are formed in the dielectric layers 130 by the first conductive patterns 114.

In the present embodiment, the dielectric layers 130 can completely cover the electrical devices 120 and the first conductive patterns 114. One of the objectives for forming the dielectric layers 130 on the circuit board 110 is to fix the electrical devices 120 on the circuit board 110. In the present embodiment, a material of the dielectric layers 130 is, for example, high molecular polymer.

Figure 1E:
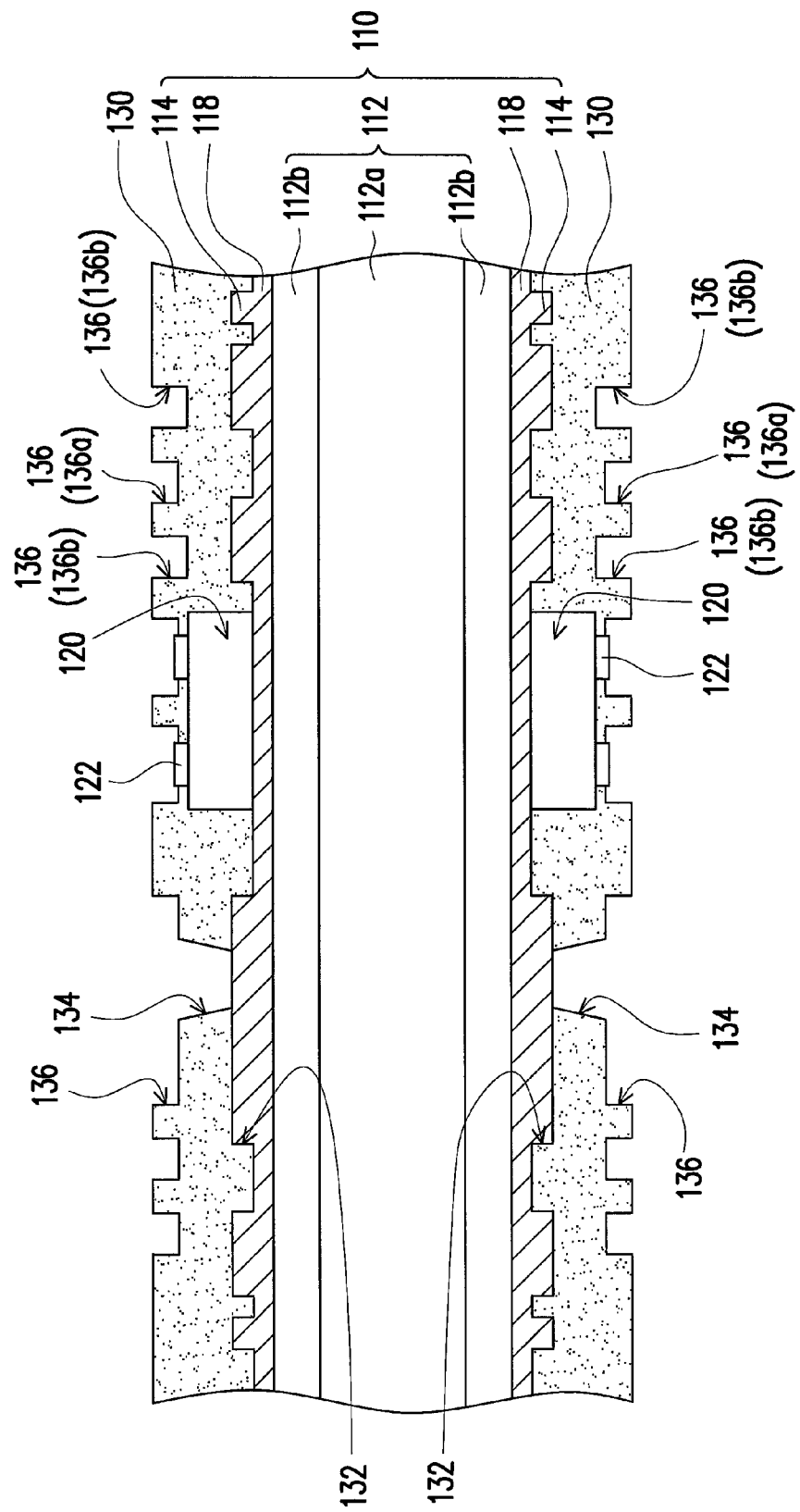

Referring to FIG. 1E. Next, the dielectric layers 130 are patterned to form through holes 134 extended to the first conductive patterns 114 and second caving patterns 136 connecting with the through holes 134 and exposing the electrodes 122. In present embodiment, the second caving patterns 136 have first cavings 136a and two second cavings 136b on two opposite sides of the first cavings 136a and the depth of one of the second cavings 136b is deeper than the depth of the first caving 136a. In the present embodiment, the step of patterning the dielectric layers 130 include forming the through holes 134 and second caving patterns 136 by beaming the dielectric layers 130 with laser beam (not illustrated herein). More specifically, given that trench degrees of the through holes 134 formed and the second caving patterns 136 are different, in the present embodiment, the through holes 134 and the second caving patterns 136 can be formed by beaming laser beam to the dielectric layers 130 via gray tone mask (not illustrated herein). For example, gray tone mask can have a first transparent region containing high transmittance, a second transparent region containing intermediate transmittance and a third transparent region containing low transmittance. The through hole 134 having a degree of deeper trench can be formed in the dielectric layers 130 after portions of laser beam pass through the first transparent region containing high transmittance. The second cavings 136b having a degree of less deeper trench can be formed in the dielectric layers 130 after portions of laser beam pass through the second transparent region containing intermediate transmittance, and the first caving 136a having a degree of least deep trench can be formed in the dielectric layers 130 after portions of laser beam pass through the third transparent region containing low transmittance.

Figure 1F:
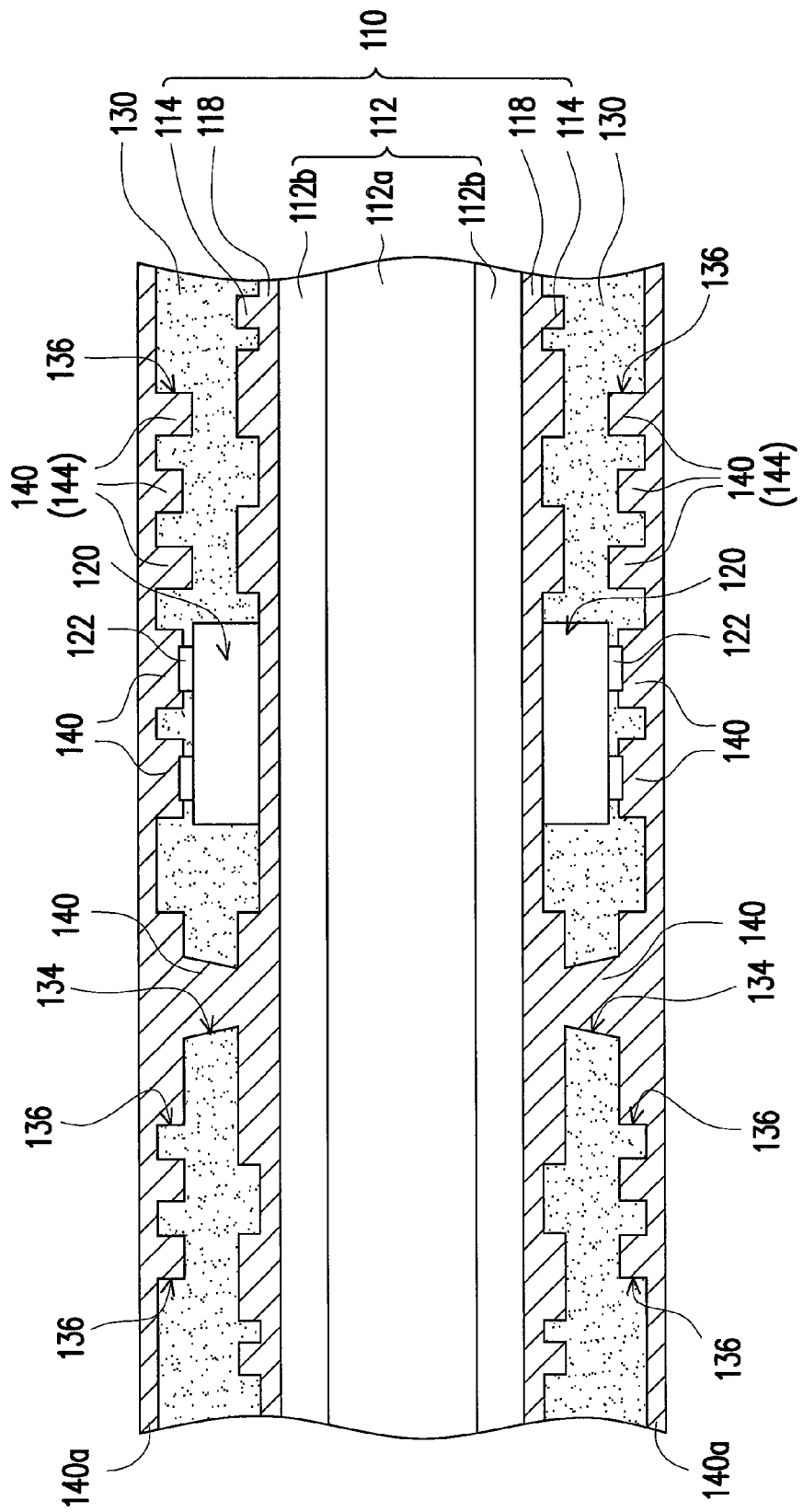
Figure 1G:
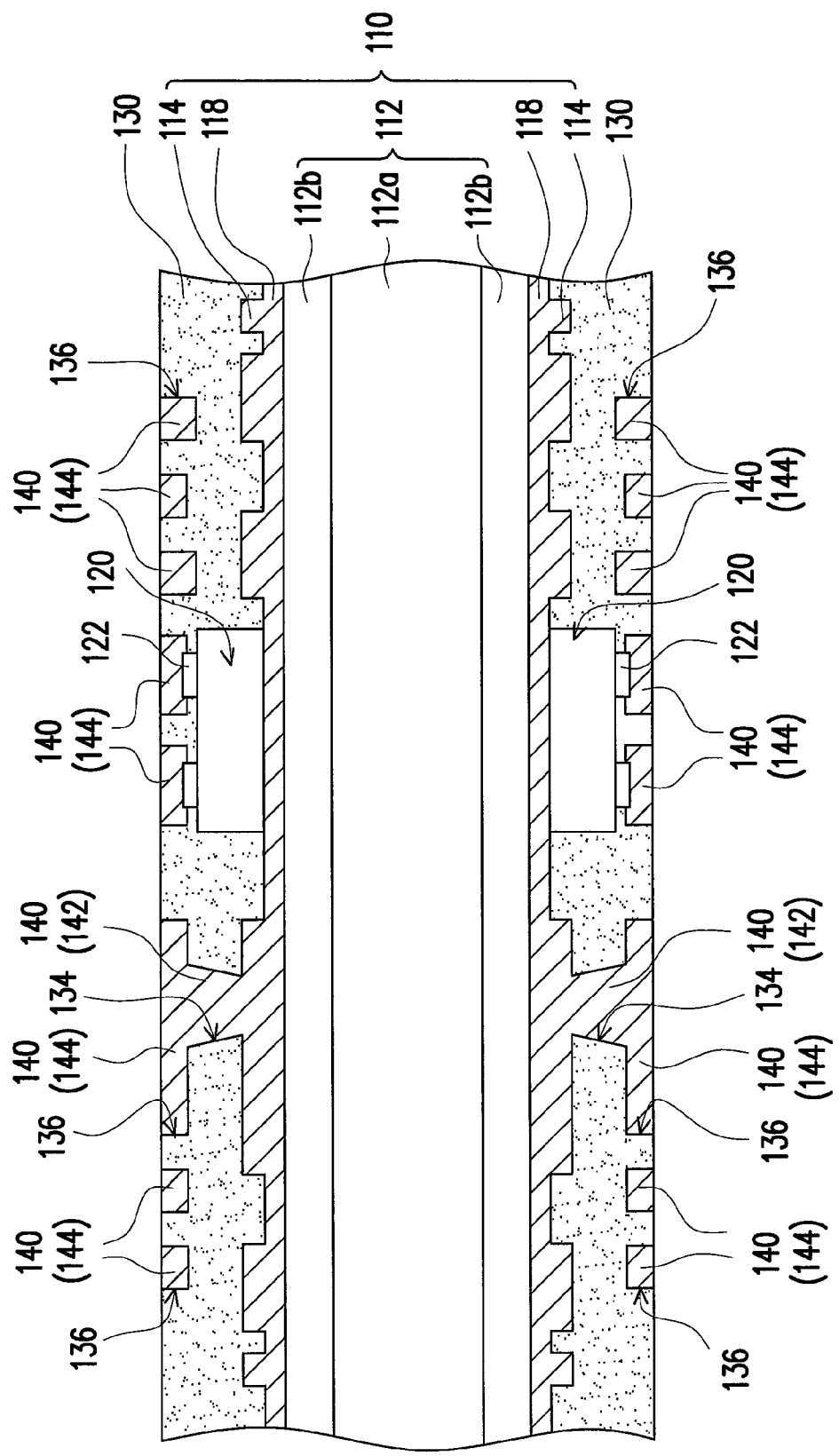
Figure 1H:
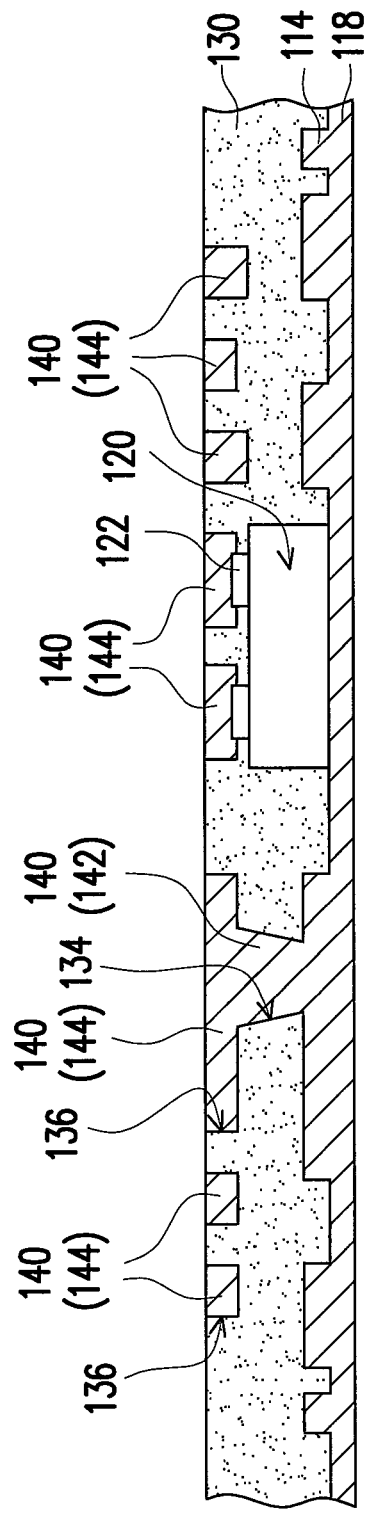
Figure 1I:
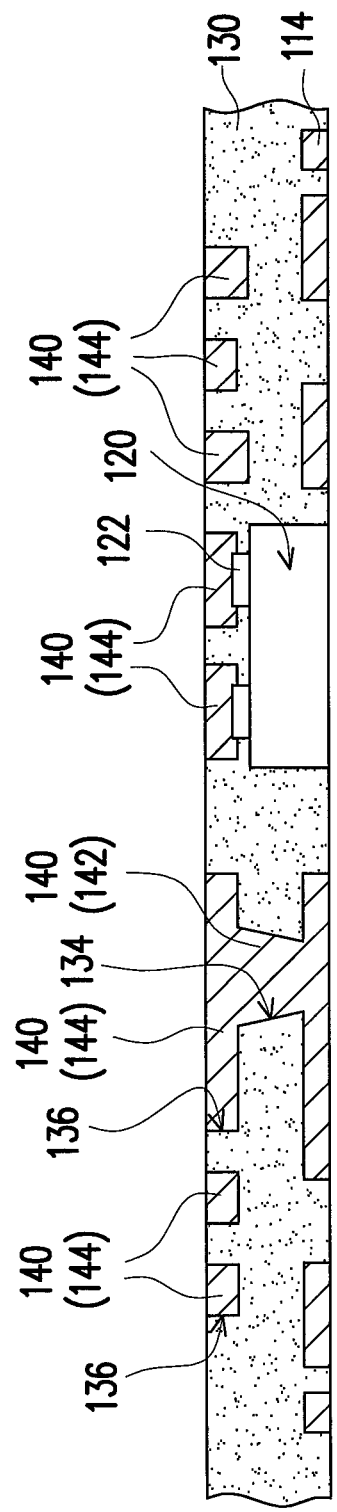

Referring to FIG. 1F and FIG. 1G. Next, a conductive material 140 is filled in the through holes 134 and the second caving patterns 136 to form conductive vias 142 in the through holes 134 and second conductive patterns 144 are formed in the second caving patterns 136 (as illustrated in FIG. 1G). More specifically, as shown in FIG. 1F, second conductive layers 140a can first be formed on the second caving patterns 136, wherein the second conductive layers 140a are extended to the insides of the through holes 134 and the second caving patterns 136, and the second conductive layers 140a completely cover the dielectric layers 130. In the present embodiment, the second conductive layers 140a can be formed on the second caving patterns 136 utilizing electroplating process, but the invention is not limited herein. Then, as shown in FIG. 1G, portions of the second conductive layers 140 are removed and the conductive vias 142 filled in the through holes 134 and the second conductive patterns 144 filled in the second caving patterns 136 remain.

Figure 1J:
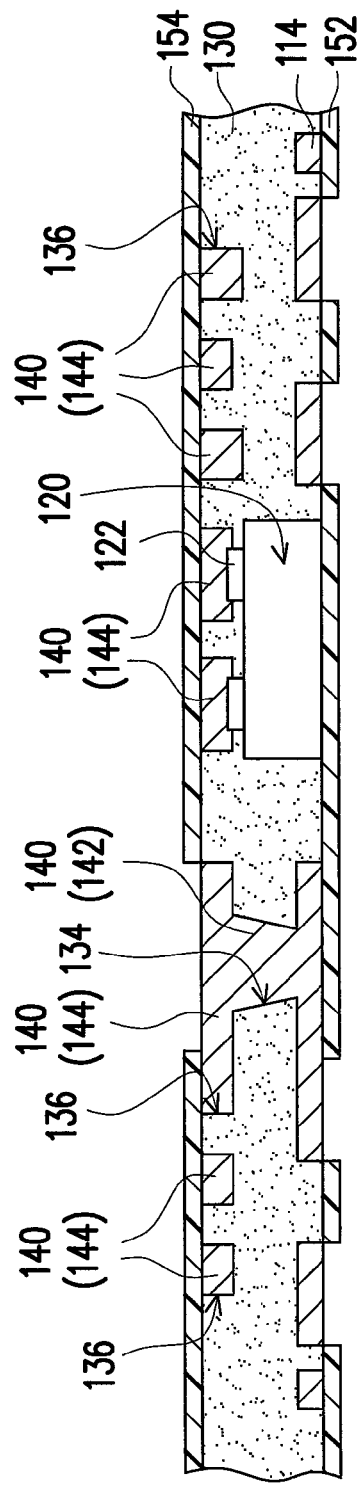

Referring to FIG. 1G and FIG. 1H. Next, the substrate 112 is removed. As shown in FIG. 1H, in the present embodiment, the electroplated seed layers 118 can further be removed after the substrate 112 is removed. In the present embodiment, the electroplated seed layers 118 can be removed utilizing an etching process. Referring to FIG. 1J. Next, a first solder mask 152 and a second solder mask 154 are formed on the first conductive pattern 114 and the second conductive pattern 144, respectively. The first solder mask 152 exposes portions of the first conductive pattern 114. The second solder mask 154 exposes portions of the second conductive pattern 144. In the present embodiment, the second solder mask 154 can expose portions of the second conductive pattern 144 connected with the conductive vias 142.

Figure 1K:
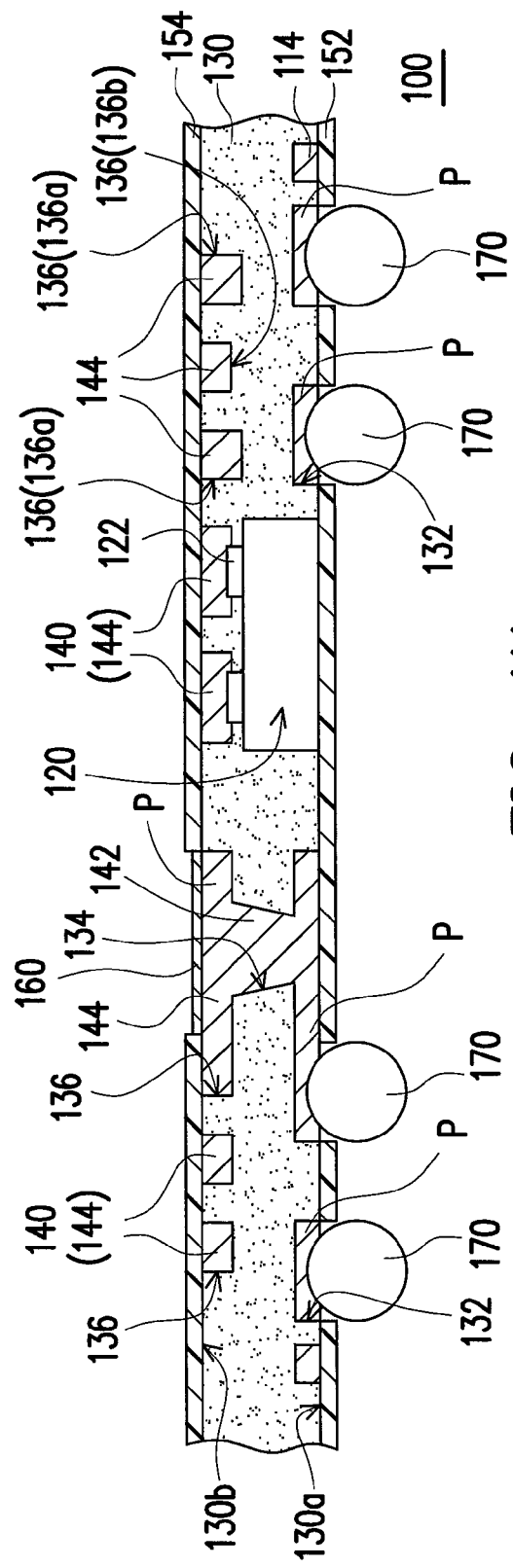

Referring to FIG. 1K. Next, a protective layer 160 is formed, wherein in portions of the first conductive pattern 114 exposed by the first solder mask 152 and portions of the second conductive pattern 114 exposed by the second solder mask 154 form a plurality of bonding pads P, and the protective layer 160 covers at least one bonding pad P. In the present embodiment, a material of the protective layer 160 is, for example, gold. Then, solder balls 170 are formed, wherein the solder balls 170 are connected with at least one bonding pad P. An electrical device package structure 100 according to the present embodiment is then built.

Referring to FIG. 1K. The electrical device package structure 100 of the present embodiment includes a dielectric layer 130, an electrical device 120, a first conductive pattern 114, a second conductive pattern 144, a conductive via 142, a first solder mask 152 and a second solder mask 154.

The dielectric layer 130 has a first surface 130a, a second surface 130b opposite to the first surface 130a, a first caving pattern 132 disposed on the first surface 130a and trenched the second surface 130b, at least one second caving pattern 136 disposed on the second surface 130b and trenched the second surface 130b and at least one through hole 134 extended from the first caving pattern 132 to the second caving pattern 136. The electrical device 120 is embedded in the dielectric layer 130 and has at least one electrode 122. The electrode 122 is exposed in the second caving pattern 136.

The first conductive pattern 114 is filled in the first caving pattern 132. The second conductive pattern 144 is filled in the second caving pattern 136 and connected with the electrodes 122 of the electrical device 120. In the present embodiment, the first conductive pattern 114 substantially is flushed with the first surface 130a and the second conductive pattern 144 substantially is flushed with the second surface 130b. It should be noted that, in present embodiment, the second caving pattern 136 can have a first caving 136a and two second cavings 136b on two opposite sides of the first caving 136a and the depth of one of the second cavings 136b is deeper than the depth of the first caving 136a. Portions of the second conductive pattern 144 filled in the second cavings 136b can be shielded by portions of the second conductive pattern 144 filled in the first caving 136a. As a result, percentages of external noise jamming interrupting electrical signals transmitted in portions of the second conductive pattern 144 filled in the second cavings 136b can be reduced significantly with shielding effects that portions of the second conductive pattern 144 are filled in the first caving 136a.

The conductive via 142 is filled in the through hole 134 and connected with the first conductive pattern 114 and the second conductive pattern 144. The first solder mask 152 is disposed on the first surface 130a of the dielectric layer 130 and the first conductive pattern 114, and exposes portions of the first conductive pattern 114. The second solder mask 154 is disposed on the second surface 130b of the dielectric layer 130 and the second conductive pattern 144, and exposes portions of the second conductive pattern 144. In the present embodiment, portions of the second conductive pattern 114 exposed by the second solder mask 154 is connected with the conductive via 142.

The electrical device package structure 100 of the present embodiment can further include a protective layer 160. Portions of the first conductive pattern 114 exposed by the first solder mask 152 and portions of the second conductive pattern 144 exposed by the second solder mask 154 form a plurality of bonding pads P. The protective layer 160 covers at least one bonding pad P. The electrical device package structure 100 of the present embodiment can include, by choice, solder balls 170. The solder balls 170 are connected with at least one bonding pad P.

It should be noted that, in the electrical device package structure 100 of the present embodiment, the first conducive pattern 114, and the second conductive pattern 144 and the electrical device 120 are embedded in the dielectric layer 130 and therefore the overall thickness of the electrical device package structure 100 can be reduced significantly, and then electronic apparatus adopting the electrical device package structure 100 can have strength in designs of being light, thin, compact and small.

In view of the above, in the invention, the electrical device can be embedded in the dielectric layer to reduce significantly the overall thickness of the electrical device package structure. In addition, the overall thickness of the electrical device package structure can be further reduced by filling a conductive material in the caving pattern of the dielectric layer to form a conductive pattern.

Although the invention has been described by the above embodiments, they are not intended to limited the invention. It is apparent to people of the ordinary skill in the art that modifications and variations to the invention may be made without departing from the spirit or the scope of the invention. Therefore, the protecting scope of the invention is defined by the appended claims.

What is claimed is:

1. An electrical device package structure comprising:
   a dielectric layer having a first surface, a second surface opposite to the first surface, a first caving pattern disposed on the first surface and caved into the first surface, at least one second caving pattern disposed on the second surface and caved into the second surface and at least one through hole extended from the first caving pattern to the second caving pattern;
   an electrical device embedded in the dielectric layer and having at least one electrode and the electrode exposing the second caving pattern;
   a first conductive pattern filled in the first caving pattern;
   a second conductive pattern filled in the second caving pattern and connected with the electrode of the electrical device;
   a conductive via filled in the through hole and connected with the first conductive pattern and the second conductive pattern;
   a first solder mask disposed on the first surface and the first conductive pattern of the dielectric layer, and exposing portions of the first conductive pattern, wherein a surface of the electrical device directly contacted with the first solder mask and a surface of the first conductive pattern directly contacted with the first solder mask are located in a single plane; and
   a second solder mask disposed on the second surface and the second conductive pattern of the dielectric layer, and exposing portions of the second conductive pattern.

2. The electrical device package structure as recited in claim 1, wherein the first conductive pattern substantially flushes with the first surface, and the second conductive pattern substantially flushes with the second surface.

3. The electrical device package structure as recited in claim 1 further comprising:
   a protective layer, wherein portions of the first conductive pattern exposed by the first solder mask and portions of the second conductive pattern exposed by the second solder mask form a plurality of bonding pads, and the protective layer covers one of the bonding pads.

4. The electrical device package structure as recited in claim 1 further comprising:
   a solder ball, wherein portions of the first conductive pattern exposed by the first solder mask and portions of the second conductive pattern exposed by the second solder mask form a plurality of bonding pads, and the solder ball connects with one of the bonding pads.

* * * * *